US010149389B2

(12) United States Patent
Surinya

(10) Patent No.: US 10,149,389 B2
(45) Date of Patent: Dec. 4, 2018

(54) INTRINSICALLY SAFE MOBILE DEVICE WITH REDUCTION IN SPARKING RISK AND SURFACE HEATING

(71) Applicant: Aegex Technologies, LLC, Atlanta, GA (US)

(72) Inventor: Endre Surinya, Pecs (HU)

(73) Assignee: Aegex Technologies, LLC, Atlanta, GA (US)

( * ) Notice: Subject to any disclaimer, the term of this patent is extended or adjusted under 35 U.S.C. 154(b) by 0 days.

(21) Appl. No.: 15/353,722

(22) Filed: Nov. 16, 2016

(65) Prior Publication Data

US 2017/0142840 A1    May 18, 2017

Related U.S. Application Data

(60) Provisional application No. 62/255,531, filed on Nov. 16, 2015.

(51) Int. Cl.
  *H05K 1/18* (2006.01)
  *H05K 5/00* (2006.01)
  *H05K 1/02* (2006.01)

(52) U.S. Cl.
  CPC .......... *H05K 1/186* (2013.01); *H05K 1/0213* (2013.01); *H05K 5/0086* (2013.01); *H05K 2201/10015* (2013.01); *H05K 2201/10022* (2013.01); *H05K 2201/10166* (2013.01); *H05K 2201/10181* (2013.01); *H05K 2201/10356* (2013.01)

(58) Field of Classification Search
  None
  See application file for complete search history.

(56) References Cited

U.S. PATENT DOCUMENTS

| 4,463,399 A | * | 7/1984 | Matherly | ............... F21V 23/00 |
| | | | | 340/815.45 |
| 4,796,159 A | * | 1/1989 | Miksche | ............... H05K 7/1454 |
| | | | | 174/50 |

(Continued)

FOREIGN PATENT DOCUMENTS

WO    WO2014075111    *    5/2014    ............... H02H 9/00

*Primary Examiner* — Chau N Nguyen
*Assistant Examiner* — Muhammed Azam
(74) *Attorney, Agent, or Firm* — Todd Partners, P.C.; Jack D. Todd

(57) ABSTRACT

An improved intrinsically safe mobile device is designed to reduce sparking risk and surface heating while still maintaining a form factor, processing speed, and functionality comparable to conventional mobile devices. Non-intrinsically safe electronic components are mounted on an unprotected part of a printed circuit board (PCB) contained within the mobile device and are encapsulated to reduce risk of sparking and to minimize surface heating to enable the encapsulated electronic components to be certified as intrinsically safe. The encapsulated electronic components are connected using a trace with intrinsically safe electronic components mounted on a protected part of the PCB and are connected with user interface components using FPC cabling. The trace and FPC cabling are certified as intrinsically safe using one or more protection techniques, such as through use of a resistor, a double MOSFET clamping circuit, a capacitor, a fuse, or maintaining a minimum clearance space.

20 Claims, 8 Drawing Sheets

(56) References Cited

U.S. PATENT DOCUMENTS

| | | | | |
|---|---|---|---|---|
| 4,968,978 A * | 11/1990 | Stolarczyk | | E21C 35/24 175/40 |
| 5,307,519 A * | 4/1994 | Mehta | | H01M 10/42 361/704 |
| 5,482,793 A * | 1/1996 | Burns | | H01M 10/486 320/150 |
| 5,519,587 A * | 5/1996 | Baggio | | F21L 14/00 362/158 |
| 6,062,095 A * | 5/2000 | Mulrooney | | G01D 11/24 73/204.22 |
| 6,501,200 B2 * | 12/2002 | Engel | | H02K 29/08 310/68 R |
| 6,611,208 B1 * | 8/2003 | Ketler | | G08B 17/10 340/534 |
| 7,312,716 B2 * | 12/2007 | Kothari | | H02H 9/008 340/635 |
| 7,319,191 B2 * | 1/2008 | Poon | | H05K 5/06 174/50.62 |
| 7,894,175 B2 * | 2/2011 | Florin | | G01D 11/245 361/111 |
| 7,898,786 B2 * | 3/2011 | Schmidt | | G05B 19/0428 361/119 |
| 8,804,855 B2 * | 8/2014 | Lenzing | | E21F 17/18 375/219 |
| 8,929,948 B2 * | 1/2015 | Vanderaa | | G01D 11/245 439/709 |
| 2002/0191372 A1 * | 12/2002 | Mancini | | C22F 1/04 361/528 |
| 2002/0191396 A1 * | 12/2002 | Reiff | | F21V 13/12 362/236 |
| 2003/0077379 A1 * | 4/2003 | Roberts | | H05K 9/0016 427/1 |
| 2004/0201363 A1 * | 10/2004 | Mathiowetz | | H01M 2/0262 320/112 |
| 2004/0207330 A1 * | 10/2004 | Ruffell | | G09F 13/22 315/169.3 |
| 2005/0288799 A1 * | 12/2005 | Brewer | | G05B 19/05 700/1 |
| 2009/0180263 A1 * | 7/2009 | Eriksen | | H05K 1/147 361/752 |
| 2011/0014882 A1 * | 1/2011 | Vanderaa | | H05K 7/1462 455/90.3 |
| 2011/0053526 A1 * | 3/2011 | Strei | | H05K 7/1462 455/90.3 |
| 2011/0140824 A1 * | 6/2011 | Herhold | | H01F 27/2804 336/200 |
| 2011/0211289 A1 * | 9/2011 | Kosowsky | | H01L 27/0288 361/91.1 |
| 2012/0315793 A1 * | 12/2012 | Hermann | | G05B 19/0425 439/620.01 |
| 2013/0003329 A1 * | 1/2013 | Petchey | | H04M 1/185 361/760 |
| 2013/0135832 A1 * | 5/2013 | Stritzelberger | | H02B 1/28 361/752 |
| 2013/0193763 A1 * | 8/2013 | Zhao | | E21F 17/06 307/65 |
| 2013/0208437 A1 * | 8/2013 | Balle | | G01D 11/24 361/807 |
| 2013/0241416 A1 * | 9/2013 | Toth | | H05B 33/0821 315/127 |
| 2014/0050945 A1 * | 2/2014 | Kiger | | H01M 2/0413 429/7 |
| 2015/0083492 A1 * | 3/2015 | Wassell | | E21B 44/00 175/24 |
| 2015/0114022 A1 * | 4/2015 | Kreeley | | B23P 19/04 62/259.2 |
| 2015/0366084 A1 * | 12/2015 | Arul | | H01R 43/005 361/752 |
| 2016/0262254 A1 * | 9/2016 | Meijer | | G01F 23/284 |
| 2016/0269067 A1 * | 9/2016 | Pidwerbecki | | G06F 1/1626 |
| 2017/0142840 A1 * | 5/2017 | Surinya | | H05K 1/0213 |

* cited by examiner

INTRINSICALLY SAFE MOBILE DEVICE WITH REDUCTION IN SPARKING RISK AND SURFACE HEATING

CROSS REFERENCE TO RELATED APPLICATIONS

This patent application claims priority benefit under 35 U.S.C. § 119(e) of U.S. Prov. Pat. Appl. No. 62/255,531, entitled "Intrinsically Safe Mobile Device," filed Nov. 16, 2015, which is incorporated by reference as if set forth in full herein.

FIELD OF THE PRESENT TECHNOLOGY

The systems, methods, and devices described herein relate generally to hand-held mobile devices and, more particularly, to hand-held mobile devices constructed, designed, and certifiable as "Intrinsically Safe" (or "I-Safe" or "IS") for safe use in potentially explosive atmospheres and/or hazardous environments while at the same time maintaining the form factor, speed, and functionality of conventional non-IS mobile devices.

BACKGROUND OF THE PRESENT TECHNOLOGY

The design, certification, and manufacture of a hand-held mobile communication and/or data collection devices for use in a potentially explosive or volatile atmosphere present an array of challenges. Modern communication equipment, such as smartphones, portable tablets, and other hand-held computing devices (i.e., "mobile devices"), require significant power and stored capacitance to operate the vast array of power hungry components that make up such equipment. Such components include micro-processors, 4G and similar telecommunications components, Wi-Fi, GPS, camera, touch screen, and the operating system itself. The power to operate and provide all of these features and functionality in a small, lightweight, and space-constrained form factor further complicates the design of such mobile devices.

Intrinsic safety relies on the mobile device being designed in such a way that it is unable to release sufficient energy, by either thermal or electrical means, which could cause ignition of a flammable substance. The thermal and electrical energies required to ignite various explosive groups have been proven by experimentation. Data has been produced, and can be used, to indicate safe levels of energy for various categories of hazardous environments in which such mobile devices may be used.

Historically, for a device to be certified as intrinsically safe, manufacturers have either had to: (i) sacrifice speed, performance, and functionality to limit power and current used by the device to stay within IS standards or (ii) to enable fully-powered and functional components to be used within the device but sacrificing size, shape, weight, and portability of the device as compared to conventional hand-held devices. Therefore, a need exists for intrinsically safe mobile devices that have a conventional form factor (size, shape, weight, and portability) but that can be certified IS for safe use in explosive atmospheres or hazardous environments.

The above needs and features, as well as additional aspects and business applications, are disclosed herein and will become readily apparent to one of ordinary skill in the art after reading and studying the following summary of the present inventions, the detailed description of preferred embodiments, and the claims included hereinafter. The present inventions meet one or more of the above-referenced needs as described herein in greater detail.

SUMMARY OF THE PRESENT TECHNOLOGY

The present inventions described herein relate generally to hand-held mobile devices and, more particularly, to hand-held mobile devices constructed, designed, and certifiable as "Intrinsically Safe" for use in potentially explosive atmospheres and/or hazardous environments while at the same time maintaining the form factor, speed, and functionality of conventional non-IS mobile devices. Briefly described, aspects of the present invention include the following.

In a first aspect of the present invention, an intrinsically safe mobile device having a housing, a power supply, a printed circuit board (PCB), and user interface components, the power supply providing power to the PCB and to one or more of the user interface components, the power supply and PCB contained within the housing, the user interface components contained within the housing or accessible on or through the housing, wherein the intrinsically safe mobile device includes a plurality of non-intrinsically safe electronic components mounted on an unprotected part of the PCB, wherein the plurality of non-intrinsically safe electronic components mounted on the unprotected part of the PCB are encapsulated to maintain risk of sparking and surface heating below thresholds required for the encapsulated electronic components to be certified as intrinsically safe, and a plurality of intrinsically safe electronic components mounted on a protected part of the PCB, wherein the intrinsically safe mobile device has the form factor, speed, and functionality of a conventional, non-intrinsically safe mobile device.

In a feature, the plurality of non-intrinsically safe electronic components mounted on the unprotected part of the PCB include components and circuitry that have high capacitance, high inductance, or low clearance.

In another feature, one or more of the plurality of non-intrinsically safe electronic components mounted on the unprotected part of the PCB are encapsulated by fully encasing the non-intrinsically safe electronic components in a potting material. Preferably, the potting material defines a potted area on the unprotected part of the PCB, the potting material completely surrounding and filling in all of the space around the encapsulated electronic components contained therein between a mounting surface of the PCB to at least 0.1 mm above all of the encapsulated electronic components and extending at least a 0.1 mm in thickness beyond the outermost of the encapsulated electronic components contained therein.

In another feature, one or more of the plurality of non-intrinsically safe electronic components mounted on the unprotected part of the PCB are encapsulated by surrounding the non-intrinsically safe electronic components with a potting material that defines a potted area on the unprotected part of the PCB and wherein the potted area is covered by an insulation plastic sheet that is in sealing contact with the potting material along the potted area. Preferably, the potting material completely surrounds all of the encapsulated electronic components contained within the potted area and extends at least a 0.1 mm in thickness around the outermost of the encapsulated electronic components contained therein and wherein the insulation plastic sheet is at least 0.05 mm in thickness.

In a further feature, one or more of the plurality of non-intrinsically safe electronic components mounted on the unprotected part of the PCB are encapsulated by surrounding the non-intrinsically safe electronic components with a potting material that defines a potted area on the unprotected part of the PCB and wherein the potted area is covered by a grounded metal shield that is in sealing contact with the potting material along the potted area. Preferably, the potting material completely surrounds all of the encapsulated electronic components contained within the potted area, the potting material having a height above a mounting surface of the PCB that extends above the encapsulated electronic components contained within the potted area and having a thickness of at least 0.1 mm, a metal grounding wall embedded within the potting material around an outer edge of the potted area, and the grounded metal shield extending around and over the metal grounding wall.

In yet a further feature, one or more of the plurality of non-intrinsically safe electronic components mounted on the unprotected part of the PCB is connected with one or more of the plurality of intrinsically safe electronic components mounted on the protected part of the PCB using a trace and wherein the trace is certified as intrinsically safe by using one or more protection techniques. Preferably, the one or more protection techniques are chosen from: a resistor, a double MOSFET clamping circuit, a capacitor, a fuse, and maintaining a minimum clearance space from other traces.

In a further feature, one or more of the plurality of non-intrinsically safe electronic components mounted on the unprotected part of the PCB is connected with one or more of the user interface components using a flexible printed circuit (FPC) cabling and wherein the FPC cabling is certified as intrinsically safe by using one or more protection techniques. Preferably, the one or more protection techniques are chosen from: a resistor, a double MOSFET clamping circuit, a capacitor, a fuse, and maintaining a minimum clearance space from other FPC cables.

In a feature, the power supply is a battery that is certified as intrinsically safe by encapsulating the battery. Preferably, power supply lines from the battery are certified as intrinsically safe by using one or more protection techniques chosen from: a resistor, a double MOSFET clamping circuit, a capacitor, a fuse, and maintaining a minimum clearance space between power supply lines.

In a second aspect, an intrinsically safe mobile device having a housing, a power supply, a printed circuit board (PCB), and user interface components, the power supply providing power to the PCB and to one or more of the user interface components, the power supply and PCB contained within the housing, the user interface components contained within the housing or accessible on or through the housing, wherein the intrinsically safe mobile device includes a plurality of non-intrinsically safe electronic components mounted on an unprotected part of the PCB, the plurality of non-intrinsically safe electronic components being encapsulated to maintain risk of sparking and surface heating below thresholds required for the encapsulated electronic components to be certified as intrinsically safe; and a plurality of intrinsically safe electronic components mounted on a protected part of the PCB, wherein a first of the plurality of encapsulated electronic components mounted on the unprotected part of the PCB is connected with a respective one of the plurality of intrinsically safe electronic components mounted on the protected part of the PCB using a trace, wherein a second of the plurality of encapsulated electronic components mounted on the unprotected part of the PCB is connected with a respective one of the user interface components using a flexible printed circuit (FPC) cabling, and wherein the trace and the FPC cabling are certified as intrinsically safe by using one or more protection techniques.

Preferably, the one or more protection techniques are chosen from: a resistor, a double MOSFET clamping circuit, a capacitor, a fuse, and maintaining a minimum clearance space from other traces.

In a feature, the power supply is a battery that is certified as intrinsically safe by encapsulating the battery. Preferably, power supply lines from the battery are certified as intrinsically safe by using one or more protection techniques chosen from: a resistor, a double MOSFET clamping circuit, a capacitor, a fuse, and maintaining a minimum clearance space between power supply lines.

The present inventions also encompasses computer-readable medium having computer-executable instructions for performing methods of the present invention, and computer networks and other systems that implement the methods of the present invention.

The above features as well as additional features and aspects of the present invention are disclosed herein and will become apparent from the following description of preferred embodiments of the present invention.

BRIEF DESCRIPTION OF THE DRAWINGS

The foregoing summary, as well as the following detailed description of illustrative embodiments, is better understood when read in conjunction with the appended drawings. For the purpose of illustrating the embodiments, there is shown in the drawings example constructions of the embodiments; however, the embodiments are not limited to the specific methods and instrumentalities disclosed. In addition, further features and benefits of the present technology will be apparent from a detailed description of preferred embodiments thereof taken in conjunction with the following drawings, wherein similar elements are referred to with similar reference numbers, and wherein.

DETAILED DESCRIPTION OF PREFERRED EMBODIMENTS

Figure 1:
FIG. 1 is a front view of an exemplary intrinsically safe mobile device of the present invention.

Before the present technologies, systems, products, articles of manufacture, apparatuses, and methods are disclosed and described in greater detail hereinafter, it is to be understood that the present technologies, systems, products, articles of manufacture, apparatuses, and methods are not limited to particular arrangements, specific components, or particular implementations. It is also to be understood that the terminology used herein is for the purpose of describing particular aspects and embodiments only and is not intended to be limiting.

As used in the specification and the appended claims, the singular forms "a," "an" and "the" include plural referents unless the context clearly dictates otherwise. Similarly, "optional" or "optionally" means that the subsequently described event, circumstance, or component may or may not occur or be included, and the description includes instances in which the event, circumstance, or component occurs or is included and instances where it does not.

Throughout the description and claims of this specification, the word "comprise" and variations of the word, such as "comprising" and "comprises," mean "including but not limited to," and is not intended to exclude, for example, other components, integers, elements, features, or steps. "Exemplary" means "an example of" and is not necessarily intended to convey an indication of preferred or ideal embodiments. "Such as" is not used in a restrictive sense, but for explanatory purposes only.

Disclosed herein are components that can be used to perform the herein described technologies, systems, products, articles of manufacture, apparatuses, and methods. These and other components are disclosed herein, and it is understood that when combinations, subsets, interactions, groups, etc. of these components are disclosed that while specific reference to each various individual and collective combinations and permutation of these may not be explicitly disclosed, each is specifically contemplated and described herein, for all technologies, systems, products, articles of manufacture, apparatuses, and methods. This applies to all aspects of this specification including, but not limited to, steps in disclosed methods. Thus, if there are a variety of additional steps that can be performed, it is understood that each of the additional steps can be performed with any specific embodiment or combination of embodiments of the disclosed technologies, systems, products, articles of manufacture, apparatuses, and methods.

As will be appreciated by one skilled in the art, embodiments of the present technologies, systems, products, articles of manufacture, apparatuses, and methods may be described below with reference to block diagrams and flowchart illustrations of methods, systems, processes, steps, and apparatuses. It will be understood that each block of the block diagrams and flow illustrations, respectively, support combinations of means for performing the specified functions and/or combinations of steps for performing the specified functions.

The exemplary systems, methods, and devices described herein relate generally to hand-held mobile devices and, more particularly, to hand-held mobile devices constructed, designed, and certifiable as "Intrinsically Safe" for use in potentially explosive atmospheres and/or hazardous environments while at the same time maintaining the form factor, speed, and functionality of conventional non-IS mobile devices.

As used herein, the term "mobile device" is intended to include and encompass, but not be limited to, any type of hand-held, portable, mountable, wearable, or similar computing or communication device that is usable by an individual when working or otherwise located in a hazardous or dangerous environment. Such devices include, but are not limited to, cell phones, mobile phones, smart phones, push-to-talk devices, personal digital assistants (PDAs), text or email dedicated devices, general computers, mobile PCs, tablets, laptops, electronic maps or other GPS location devices, electronic reading devices, multimedia equipment, electronic eyewear, wearable sensory or sensory-enhancement equipment, and any other computing or communication device that may be used by an employee or other individual when working or located in a hazardous or dangerous environment.

IS Design Considerations

In order to make electrical equipment safe for use in a potentially explosive atmosphere or hazardous environment, a design must be addressed "from the ground up." Design around safe operation has to be addressed in parallel with communications and device performance. Users have come to understand the value of a mobile device and its ability to run a myriad of applications, to manage email, texts, and phone capabilities, and to manage other tasks that have become a necessary component of work and daily life. Because users are familiar with highly-functional, conventional mobile devices, users expect and demand that the mobile devices they are issued and permitted to use in hazardous or dangerous environments have the same functionality, power, and speed. Ideally, the device that complies with intrinsically safe standards or requirements must still be of a size, weight, and performance that is as good as or better than a conventional mobile device a user has access to when off the job site or not working in a hazardous or dangerous environment.

Once the standards for mobile device performance and intrinsic safety have been established, the design phase can begin. These two aspects may be governed by various regulatory organizations globally. This disclosure will address aspects of design from an IS standpoint while constrained by the form factor (e.g., size, shape, and weight) and functionality (processor speed, memory, features (e.g., camera, phone, speakers, etc.) and applications (e.g., email, text, maps, GPS, productivity tools)) of conventional mobile devices.

Specifically, with respect to the mobile device performance and certifications, there are a broad range of certifications and standards that have been established to maintain performance, network conformity, and usability. These include, but are not limited to: IC, PTCRB, GCF (including field trials), R&TTE, CE, FCC, and many more.

Intrinsic safety certifications are overseen by international governing bodies to ensure that certified devices operate safely when used in explosive atmospheres and hazardous environments. The theory behind intrinsic safety is to ensure that the available electrical and thermal energy within the device is always low enough that ignition of the hazardous atmosphere cannot occur.

A very small amount of energy is required to cause an ignition. For example, a mixture of hydrogen in air requires only 20 µJ of energy to ignite. In electrical circuits the mechanism for the release of this ignition energy is one or more of the following:

Open circuit or short circuit components or interconnections in a resistive circuit;

Short circuit of components or interconnections in a capacitive circuit;

Open circuit components or interconnections in an inductive circuit; or

Ignition by hot surfaces.

As of July 2003, organizations in the European Union (EU) must follow the directives to protect employees from explosion risk in areas with an explosive atmosphere. Globally, most countries and multi-national businesses have adopted the EU standard for defining intrinsic safety called ATEX—(ATmosphere EXplosibles—English, Explosive Atmospheres). In the United States (US), UL 913 is the primary standard. Both UL 913 and ATEX have similar testing methodologies.

There are two ATEX directives (one for the manufacturer and one for the user of the equipment):

The ATEX 95 equipment directive 94/9/EC applies to equipment and protective systems intended for use in potentially explosive atmospheres;

The ATEX 137 workplace directive 99/92/EC defines minimum requirements for improving the safety and health protection of workers potentially at risk from explosive atmospheres.

Employers must classify areas in which hazardous explosive atmospheres may occur into zones. The classification given to a particular zone, and its size and location, depends on the likelihood of an explosive atmosphere occurring and its persistence if it does.

Areas classified into zones (0, 1, 2—for gas-vapor-mist and 20, 21, 22—for dust) must be protected from potential sources of ignition. Equipment and protective systems that are intended to be used in zoned areas must meet the requirements of the directive. Zone 0 and 20 require Category 1 marked equipment; zone 1 and 21 require Category 2 marked equipment; and zone 2 and 22 require Category 3 marked equipment. Zone 0 and 20 are the zones with the highest risk of an explosive atmosphere being present. See TABLE 1 (below).

The aim of directive 94/9/EC is to allow the free trade of "ATEX" equipment and protective systems within the EU by removing the need for separate testing and documentation for each member state.

The regulations apply to all equipment intended for use in explosive atmospheres, whether electrical or mechanical, including protective systems. There are two categories of equipment: I for mining and II for surface industries. Manufacturers who apply its provisions and affix the CE marking and the Ex marking are able to sell their equipment anywhere within the EU without any further requirements being applied with respect to the risks covered. The directive covers a wide range of equipment, potentially including equipment used on fixed offshore platforms, in petrochemical plants, mines, flour mills, and other areas where a potentially explosive atmosphere may be present.

In very broad terms, there are three preconditions for the directive to apply. Specifically, the equipment: 1) must have its own effective source of ignition; 2) be intended for use in a potentially explosive atmosphere (air mixtures); and 3) be under normal atmospheric conditions.

Manufacturers/suppliers (or importers, if the manufacturers are outside the EU) must ensure that their products meet essential health and safety requirements and undergo appropriate conformity procedures for ATEX certification. This usually involves testing and certification by a "third-party" certification body; however, manufacturers/suppliers can "self-certify" Category 3 equipment (technical dossier including drawings, hazard analysis, and user's manual in the local language) and Category 2 non-electrical equipment. For Category 2, the technical dossier must be lodged with a notified body. Once certified, the equipment is marked by the 'CE' (meaning it complies with ATEX and all other relevant directives) and 'Ex' symbol to identify it as approved under the ATEX directive. The technical dossier must be kept for a period of 10 years.

Certification ensures that the equipment or protective system is fit for its intended purpose and that adequate information is supplied with it to ensure that it can be used safely.

There are four ATEX classifications to ensure that a specific piece of equipment or protective system is appropriate and can be safely used in a particular application:

1. Industrial or Mining Application;
2. Equipment Category;
3. Atmosphere; and
4. Temperature.

EN 60079-11 outlines the ATEX assessment criteria for intrinsic safety. The markings for an ib rated ATEX Category 2 marking could be presented as follows: ATEX II 2G Ex ib IIC T4 (IECEx Gb), where the markings are defined as follows:

II—Electrical Equipment intended for use in places with an explosive gas atmosphere (other than mines susceptible to firedamp).

2G—Equipment suitable for Zone 1 (Gas). Zone 1—A place in which an explosive atmosphere is likely to occur in normal operation or can be expected to present frequently (10-1000 hours/year).

Ex—Symbol indicating explosive protection.

ib—Type of protection, Intrinsic Safety as per EN 60079-11 see Table 1 below.

IIC—Explosive gas group, surface industry, typical gas is Acetylene/Hydrogen, <20 µJ of ignition energy.

T4—Temperature class, max surface temp of 135° C. based on ambient 40° C.

See TABLE 1 below for further definition.

TABLE 1

| Symbol | Classification | Criteria for Zone |
|---|---|---|
| Ex ia | Zone 0 | Flammable material always present or for long periods (e.g., >1000 hr/yr) |
| Ex ia | Zone 20 | Flammable material always present or for long periods (e.g., >1000 hr/yr) |
| Ex ib | Zone 1 | Flammable material present in normal operation (e.g., 10 to 1000 hr/yr) |
| Ex ib | Zone 21 | Flammable material present in normal operation (e.g., 10 to 1000 hr/yr) |
| Ex ib | Zone 2 | Flammable material present for short periods only (e.g., <10 hr/yr) |
| Ex ib | Zone 22 | Flammable material present for short periods only (e.g., <10 hr/yr) |

In addressing ATEX standard for intrinsic safety, as defined above in TABLE 1, the level of protection should be defined specific to the use case. In determining the appropriate level of certification, key questions need to be answered, such as where are target users working and is there wireless coverage present. Where zone 0 might reach all employees, wireless service is not likely to exist in these environments. Zone 1 "Ex ib" reaches the majority of the labor force, while operating in areas likely to maintain wireless coverage.

To achieve ib level of protection, the ATEX standard requires, in testing or assessing the circuits for spark ignition, that a safety factor of 1.5 be applied in accordance with section 10.1.4.2 of the directive. The safety factor applied to the voltage or current for the determination of surface temperature classification must be 1.0 in all cases.

Additionally, ib protection requires a fault assessment on all circuits within the system. The system is defined as the entire electronic apparatus—including battery and any accessories operating in the ib rated environment. Faults are defined as follows:

Countable fault—A countable fault is a safety design element that is not fail safe, and can fail under foreseeable conditions.

Non-countable fault—A non-countable fault is a safety design element that is assumed to fail at any time, and is not relied upon for intrinsic safety protection.

Infallible isolation—An infallible component or isolation is one that is not subject to a countable fault or remains safe after being subject to a countable fault.

In order to test countable faults to determine infallible isolation, the following test standard applies. Non-countable faults applied may differ in each of the below circumstances.

Um=Maximum voltage that can be applied to the non-intrinsically safe connection facilities of associated apparatus without invalidating the type of protection.

Ui=Maximum voltage (peak AC or DC) that can be applied to the connection facilities of apparatus without invalidating the type of protection.

With Um and Ui applied, the intrinsically safe circuits in an electrical apparatus with a level of protection "ib" must not be capable of causing ignition in each of the following circumstances:

In normal operation and with the application of those non-countable faults which give the most onerous condition.

In normal operation and with the application of one countable fault plus the application of those non-countable faults which give the most onerous condition.

In normal uses, electrical equipment often creates very small internal sparks in switches, motor brushes, connectors, and in other places. Such sparks can ignite flammable substances present in air. For example, during marine transfer operations when flammable products are transferred between the marine terminal and tanker ships or barges, non-intrinsically safe two-way radio communication is kept to a minimum for safety purposes.

Intrinsic safety can be achieved by ensuring that only low voltages and currents enter the hazardous area, and that all voltage and currents are protected utilizing other means, such as for example but not limited to zener diodes, capacitors, resistors. Sometimes an alternative type of barrier known as a galvanic isolation barrier may be used. Another aspect of intrinsic safety is controlling abnormal small component temperatures. Under certain fault conditions (such as an internal short inside a semiconductor device), the temperature of a component case can rise to a much higher level than in normal use.

With the level of protection determined for a mobile device, an assessment of the product is necessary. An intrinsically safe circuit on such device where "ib" level of safety is sought, must satisfy three basic criteria:

No spark ignition can result when the circuit is tested or assessed, as required by Clause 10 for the specified level of protection (see Clause 5) and grouping (see Clause 4) of electrical apparatus.

The temperature classification of intrinsically safe apparatus must be carried out in accordance with 5.6 and the temperatures requirements of IEC 60079-0 so as to ensure that ignition is not caused by hot surfaces. Temperature classification cannot apply to associated apparatus.

The circuit must be adequately separated from other circuits.

Since mobile devices include a number of different functional component, the ATEX assessment can be summarized with the following areas:

(1) Battery—The battery must comply with EN 60079-11 section 7.4 (Primary and secondary cells and batteries) & section 10.5 (Tests for cells and batteries). The battery must be tested for spark ignition, max surface temperature (135° C.), and electrolyte leakage and at least 2 levels of protection.

Some types of battery cells, particularly lithium types, may explode if short-circuited or subjected to reverse charging. The use of such cells must be confirmed by their manufacturer as being safe and compliant for use in intrinsically safe equipment as well as EN 60079-11.

If a device contains battery cells that will not be changed while in an explosive atmosphere, the spark ignition discharge at the terminals of a single cell does not have to be tested, provided that the single cell delivers a peak open-circuit voltage of less than 4.5 V (reference EN 60079-11).

A battery that supplies less than 33 W under short circuit conditions may be exempt from spark ignition testing. If the battery has the potential to supply more than 33 W under short circuit conditions, it must pass a short circuit test, and not exceed a surface temperature of 135° C. (T4), and electrolyte leakage is not allowed. The test must be conducted on 10 samples, and without the use of protection devices, unless such devices are encapsulated with the battery cell.

Figure 8:
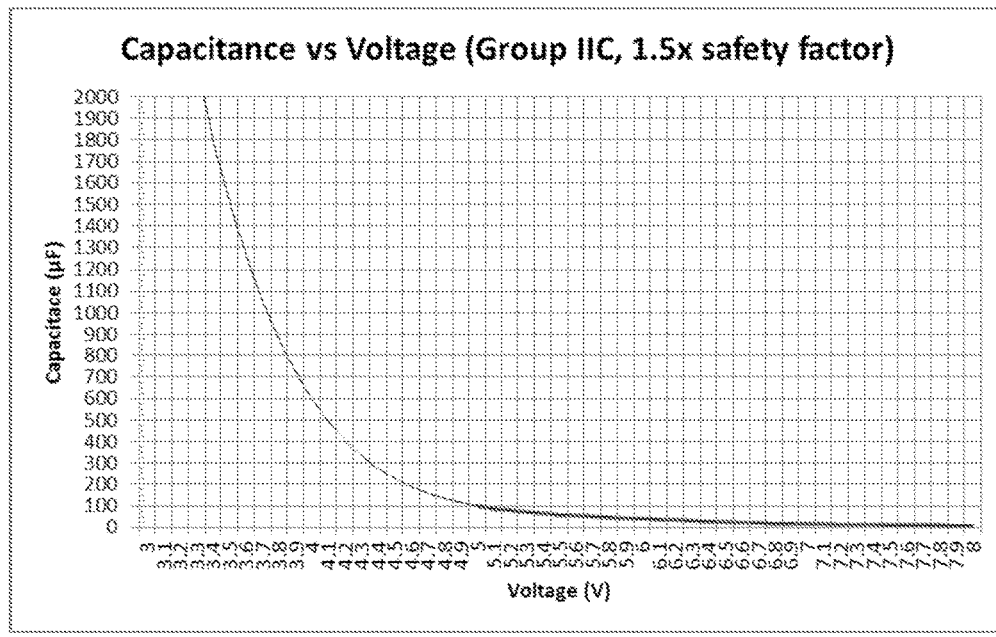
FIG. 8 illustrates Table A.2a from safety standard EN 60079-11, showing permissible capacitance values relative to voltage levels to satisfy safety standards under EN 60079-11.

(2) Capacitance—The total system capacitance cannot exceed the limits outlined in EN 60079-11 Table A.2 (Allowable capacitance=370 µF (Group IIC, 4.25V, 1.5× safety factor)). (See FIG. 8). Circuit capacitance must be limited to ensure that the available electrical and thermal energy in the system is always low enough that ignition of the hazardous atmosphere cannot occur.

To maintain performance standards set by communication governing bodies including but not limited to FCC, RT&TE, GCF, PTCRB and others, power requirements exceed 370 µF and therefore isolated PCB design and structure must be configured in non-standard mobile phone architecture. Methods for achieving this goal include, but are not limited to:

The charging circuitry is not to be used in the hazardous environment, therefore it can be ignored as long as it is inactive, and isolated from the rest of the circuitry.

Eliminate any unnecessary capacitance.

Limit working voltages to allow for higher capacitance.

Infallibly isolate major system blocks.

Evaluate local working voltage.

Must be fault tolerant.

Isolate charging circuitry.

Employ Zener barriers for fault immunity.

2 levels of redundancy.

Local encapsulation of highly capacitive electrical nodes

Must be infallibly isolated.

A very intense and detailed analysis of the system from a capacitance/power perspective is required. The results of this analysis will reveal what capacitance (if any) can be reduced, or eliminated, and what the effective system capacitance really looks like. Based on the effective capacitance, a trade-off study can be completed to identify appropriate areas in the design to be isolated, and encapsulated, or clamped to a more favorable working voltage.

(3) Inductance—(reference EN 60079-11).

(4) Surface Temperature—Max allowable surface temperature under normal, and fault conditions is 134° C. (T4).

(5) Detailed stress analysis required for each component, including battery, PCB traces, and any wiring.

Evaluate maximum power dissipation and surface temperature.

Evaluate under most onerous fault conditions.

Evaluate at 40° C. ambient.

Perform stress analysis, and address non-compliant components on a case-by-case basis. Enclosure—The enclosure must be in compliance with environmental requirements as well as thermal conditioning, and impact tests outlined in IEC 60079-0.

Housing should be anti-static in nature.

Marked properly pursuant to IAW EN60079-11.

Subject to drop test pursuant to IAW IEC 60079-0.

Battery compartment must be secured with special fasteners pursuant to IAW EN60079-11.

External contacts for charging must be enclosed.

Enclosure ≥IP30.

Contacts must be separated per EN 60079-11 clause 6.3.

Glass beads (or equivalent) to displace volatile gas.

May lighten requirements related to spark ignition or surface temp.

Enclosure should be designed per the specifications of the Environmental Test Plan. Components of this plan include:

Highly durable, heat and chemical resistant materials.

Shock and Drop Tested to standards such as Mil Std 810 G

IP67 or above dust and water proof test (6) RF—Ignition hazards from RF radiation—Typical threshold power for group IIC is 2 W CW max. The system may be utilized for life safety applications and managing the trade-off of communications quality with certification safety has to be managed. PTCRB, GCF, FCC, CE, RT&TE among other wireless radio certifications impact performance guidelines and are established independent of ATEX or UL safety standards.

Establish infallibly limit RF output power to remain compliant without adverse impact to the communications quality of the system.

(7) Piezo-electric Devices—

The maximum energy stored by the capacitance of a crystal at the maximum measured voltage shall not exceed 50 µJ for Group IIC apparatus.

Requires impact testing IAW IEC 60079-0

Address non-compliant components on a case-by-case basis, Energy limiting methods may apply.

(8) Creepage/clearance—Creepage distance—Creepage distance is the shortest path between two conductive parts (or between a conductive part and the bounding surface of the equipment) measured along the surface of the insulation. A proper and adequate creepage distance protects against tracking, a process that produces a partially conducting path of localized deterioration on the surface of an insulating material as a result of the electric discharges on or close to an insulation surface. The degree of tracking required depends on two major factors: the comparative tracking index (CTI) of the material and the degree of pollution in the environment. Used for electrical insulating materials, the CTI provides a numerical value of the voltage that will cause failure by tracking during standard testing.

(9) Clearance distance—Clearance distance is the shortest distance between two conductive parts (or between a conductive part and the bounding surface of the equipment) measured through air. Clearance distance helps prevent dielectric breakdown between electrodes caused by the ionization of air. The dielectric breakdown level is further influenced by relative humidity, temperature, and degree of pollution in the environment.

External Creepage Distance

Internal Creepage Distance

Insulation Thickness

Clearance Distance

Some things to consider when analyzing the Creepage/Clearance requirements for this or any design are:

Soldermask does not provide an effective barrier to Creepage.

Conformal Coating can provide good protection, and eliminate the path for breakdown.

Running traces under components should be avoided.

Exemplary Mobile Device

Referring now to the drawings, in which like numerals illustrate like elements throughout the several views, FIG. 1 is a front view of an exemplary, assembled mobile device 10 that has been designed and certified to be intrinsically safe while at the same time having a conventional mobile device form factor, performance speed and functionality, and suite of applications and other built-in functions.

For example, as shown, the mobile device 10 is a portable computing tablet with the following physical parameters: a dimension of approximately 273×185×16.8 mm (10.75× 7.28×0.66 in) and a weight of approximately 980 grams (2.16 lbs.). The tablet has a water-resistance enclosure rating of IP65. The tablet includes a 10.1 inch, advanced hyperviewing angle (AHVA) high definition display with a 1920× 1200 resolution, and a multi-touch, capacitive display designed to work even with gloves. The tablet includes a removable, rechargeable, lithium-polymer dual-cell battery with a 3.8V (4.35V max) and 8700 mA output rating that is designed to maintain a charge that provides up to 12 hours of web browsing between charges. The tablet includes built-in data storage and RAM comparable to conventional non-IS tablets. The tablet also includes a conventional CPU, with built-in Wi-Fi, BTLE, and GPS/GLONASS components. Preferably, the tablet includes a full size USB 2.0 port, a USB 3.0 and HDMI on system connector, a micro USB charging port, charging pads (up to 12V), a card slot for removable data storage, and a headset jack. Preferably, the tablet includes conventional front and/or rear facing cameras with flash and HD video capability, front and rear microphones, and stereo speakers. Preferably, the tablet further includes a conventional ambient light sensor, an accelerometer, a gyroscope, an E-compass, and a specific absorption rate (SAR) proximity sensor. The tablet also includes conventional hardware and software security components. The tablet includes a conventional operating system and software and functionality used by conventional smart phones, tablets, and similar mobile devices (e.g., text, email, mobile phone, browser, and productivity (document, photo, and video management) software).

As can be seen from FIG. 1, the mobile device 10 has a conventional mobile device form factor, performance speed and functionality, and suite of applications and other built-in functions. However, the mobile device 10 is also certified as intrinsically safe. The design, layout, and choice of components used for the mobile device 10 enable it to meet such IS certifications, as will be described in greater detail below.

Figure 2:
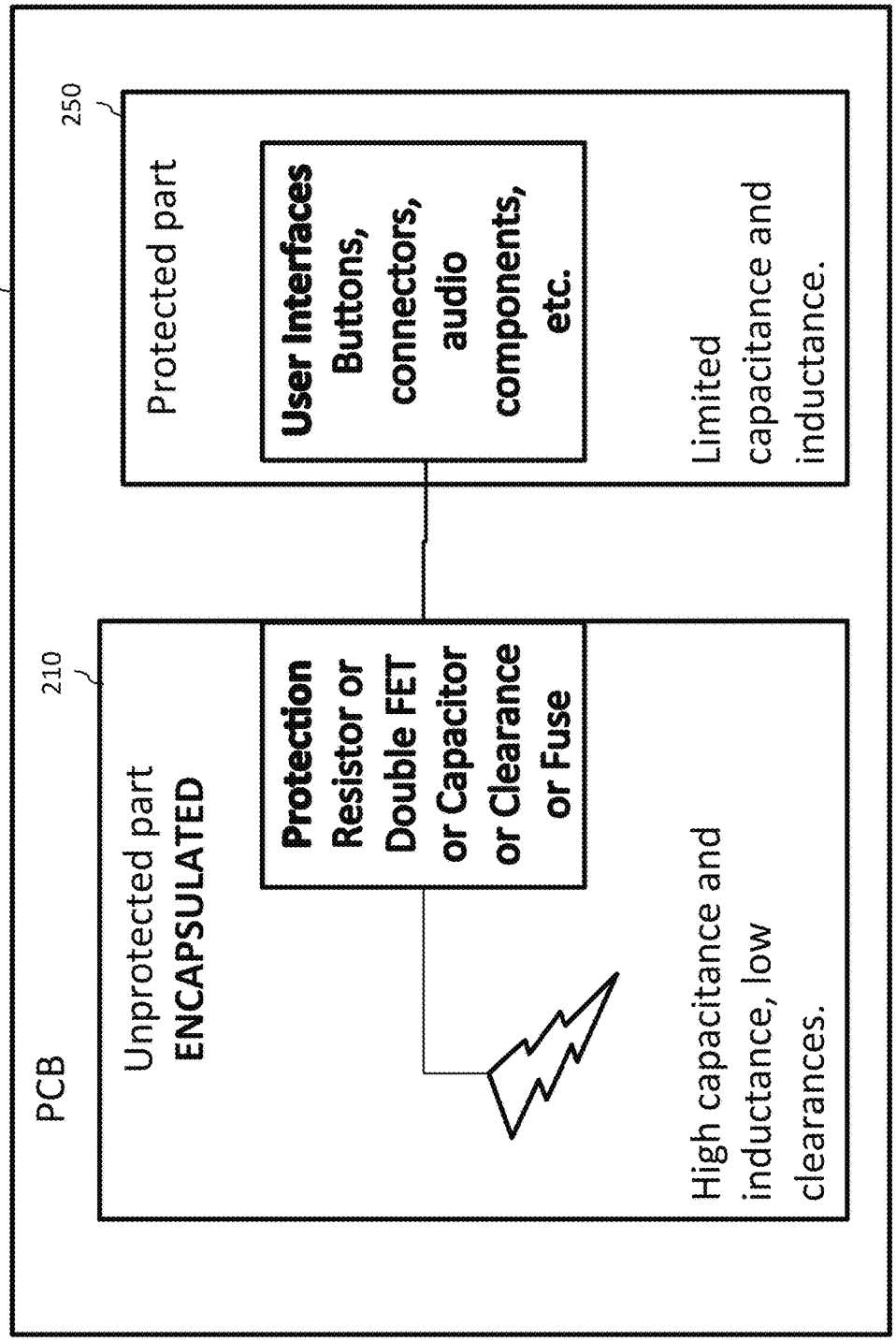
FIG. 2 is a block diagram illustrating two types of components on a main printed circuit board (PCB) used with the exemplary intrinsically safe mobile device of FIG. 1.

FIG. 2 is a block diagram of the main printed circuit board (PCB) 200 used with the exemplary intrinsically safe mobile device 100 of FIG. 1. The PCB contains the main electronic components that run the mobile device 100. The PCB is powered by the battery and interconnects with the main hardware components of the mobile device, such as the radio module, LCD display, ports, speakers, microphone, cameras, user buttons, etc. In order for the mobile device to become certified as intrinsically safe, the PCB must be designed and configured to meet intrinsically safe standards when in operation. The PCB includes two main types of components: unprotected parts 210 and protected parts 250.

As will become apparent hereinafter, unprotected parts 210 include components and circuitry on the PCB 200 that have high capacitance, high inductance, and/or low clearance. Preferably, such components and circuitry are conventional so that they provide the same functionality, speed, and performance as comparable components and circuitry available in conventional, non-IS mobile devices. Various protection or isolation techniques, described herein, are required to make such unprotected parts 210 certifiable as intrinsically safe. Protected parts 250 describe other components and circuitry on the PCB 200, such as user interfaces, user button (volume, power, etc.), audio components, and the like that are already designed to be intrinsically safe based on their limited capacitance and inductance. As will be described hereinafter, unprotected parts 210 on the PCB 200 also connect with other protected components located within the mobile device, but not on the PCB 200, such as the radio module or LCD display of the mobile device.

The main PCB 200 preferably includes a plurality of layers. To achieve intrinsic safety on the PCB, the following designs constraints are followed: (i) minimum routing distance between protected and unprotected nets under encapsulation is 0.2 mm; and (ii) if the distance between protected and unprotected traces on different layers is less than 0.2 mm, a grounding layer must be present between such traces.

Figure 3:
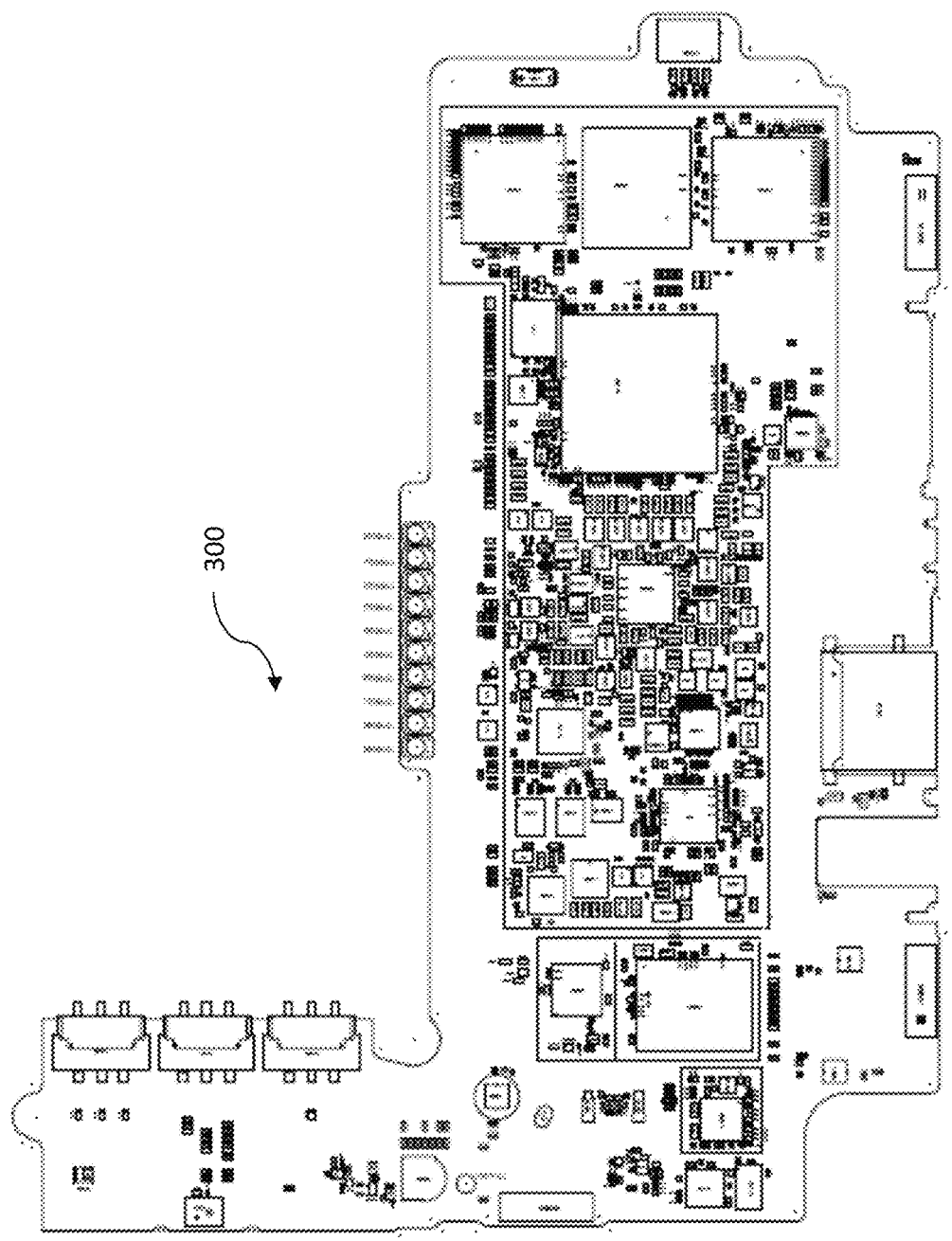
FIG. 3 illustrates an exemplary printed circuit board (PCB) used with the exemplary intrinsically safe mobile device of FIG. 1 and showing the preferred placement and arrangement of components on such PCB prior to use of techniques to make the PCB intrinsically safe.
Figure 4:
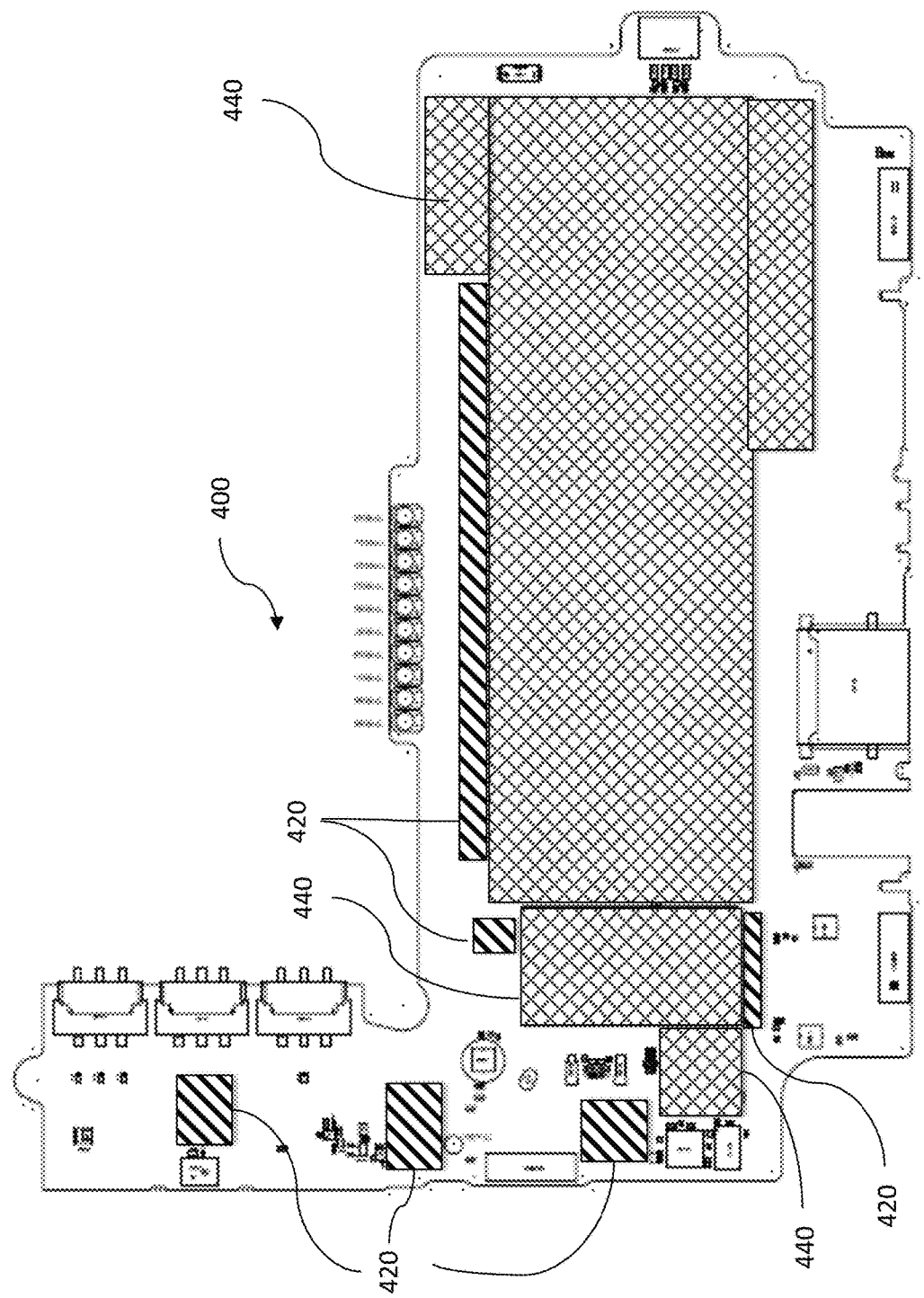
FIG. 4 illustrates the exemplary printed circuit board (PCB) of FIG. 3 but after use of techniques to make the PCB intrinsically safe.
Figure 5:
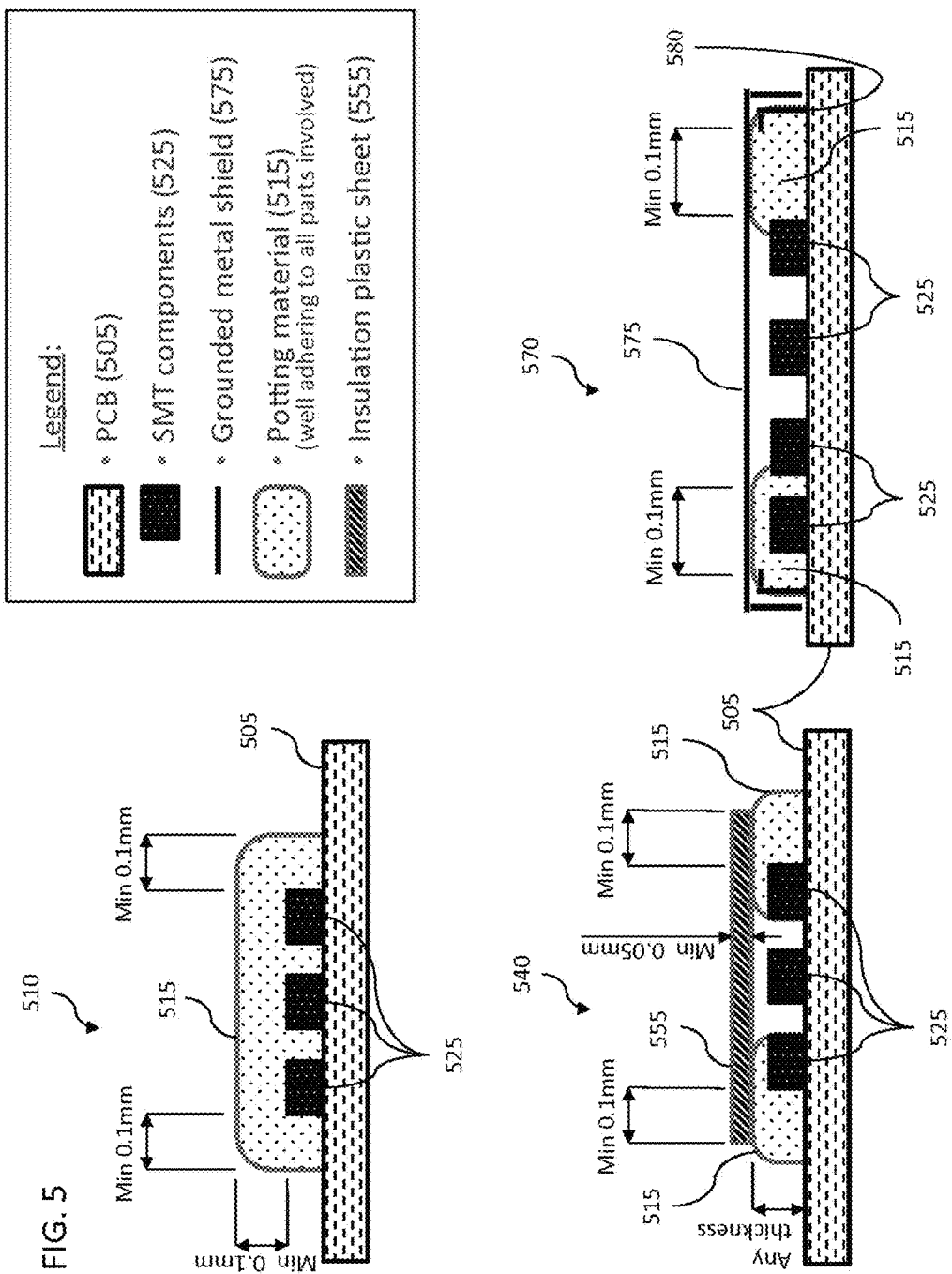
FIG. 5 illustrates several different encapsulation techniques used on components on the PCB to make the PCB intrinsically safe.

FIG. 3 illustrates an exemplary PCB 300 and shows the preferred placement and arrangement of components on such PCB prior to use of techniques to make the PCB intrinsically safe. FIG. 4 illustrates the same exemplary PCB 400, but after use of techniques to make the PCB intrinsically safe. Specifically, encapsulation techniques, which will be described in greater detail in association with FIG. 5, are used on the PCB to meet intrinsic safety standards. Before moving to FIG. 5, however, it will be apparent that free standing components are encapsulated using potting techniques 420, while groups of components can be protected and encapsulated using a grounded shield technique 440.

Several different encapsulation techniques for use on the PCB are illustrated in FIG. 5. Potting of free standing components are shown in side view in diagram 510. Specifically, diagram 510 illustrates surface mounted technology (SMT) components 525 mounted onto the PCB 505 and encapsulated with a suitable potting material 515. To meet intrinsically safe design standards, the potting material 515 surrounds all of the SMT components 525 by at least 0.1 mm on all sides and above each component 525. Preferably, the potting material 515 fills in all space between each free standing component all the way to the surface of the PCB 505.

Diagram 540 illustrates a side view of potting techniques for free standing components 525 mounted onto the PCB 505 when there are limited height or space restrictions (i.e., when there is not at least 0.1 mm of space above the components 525). In this situation, an insulation plastic sheet 555, having a thickness of at least 0.05 mm, is used to cover the top of the potted components 525. To meet intrinsically safe design standards, the potting material 515 surrounds all of the SMT components 525 by at least 0.1 mm on all sides. Since there is not enough space to have the potting material 515 extend at least 0.1 mm above the components 525, the insulation sheet 555 is used above such components 525. The insulation sheet 555 should be sealed completely with the potting material 515 around all of the potted components 525. There should be no gaps or spaces in the outer ring of potting material 515 that surrounds the potted components 525 or between the outer ring of potting material 515 and the insulation sheet 555; however, it is not necessary (but is acceptable) for potting material to fill in all of the interior space around the potted components 525 under the insulation sheet 555.

Use of a grounded shield to encapsulate multiple components is shown in side view in diagram 570. When using the grounded shield 575, a ring of potting material 515 at least 0.1 mm thick is used to ring all of the components 525 that will be under the shield 575. The metal shield 575 forms a seal along the top of the ring of potting material 515 and preferably overhangs such ring of potting material 515 and a corresponding metal shield ring 580 that connects with the PCB 505 and the outer edge of the potting material 515.

Several different techniques may be used to enable unprotected but encapsulated components 210 to communicate with protected parts 250 of the mobile device. The encapsulated components 210 are preferably separated from the protected parts of the mobile device using isolation interfaces, such as but not limited to track clearance, resistance, fuses, capacitors, or MOSFETs.

The type of isolation interface chosen is dependent on the type of encapsulated component 210 that needs to be isolated from the protected parts of the mobile device. For example, track clearance isolation may be used to separate the battery from the main PCB where power traces meet the minimum intrinsic safety separation requirements. Track clearance requires that the signal or power traces between two operational circuits have enough separation to prevent a spark from being generated.

Resistor isolation or fuse isolation techniques may be used to provide isolation or protection on traces between two operational circuits. The resistor or fuse isolation techniques are used to control the maximum current that can pass between two operational circuits. Preferably, resistor isolation is used with resistors under encapsulation and with resistors having a minimum of 1.5Ω values. Resistor isolation is preferably used on signal traces in which nominal current is insignificant. Minimum distance between poles is preferably 0.2 mm. Preferably, a trace from a protected pole is separated from unprotected traces. In case of a short in the unprotected area, the maximum current towards the protected part is defined by the following equation:

$$I_{max} = \text{SafetyFactor} \times U_{max}/R = 1.5 \times 5 \text{ V}/1.5\Omega = 5 \text{ A}$$

The capacitor isolation technique, for example, allows radio frequency (RF) signals from an antenna to be received by an RF receiver without impacting the radio frequency signal. The capacitor isolation technique isolates the radio frequency operational circuit from receiving DC or current spikes. The MOSFET isolation technique is used, for example, to protect the LCD display where power is critical, since MOSFET isolation does not impact the power. Each of the above isolation techniques limit capacitance and inductance to enable the protected parts of the mobile device to remain protected and in compliance with intrinsic safety standards even when communicating with encapsulated components and circuits on the PCB.

Figure 6:
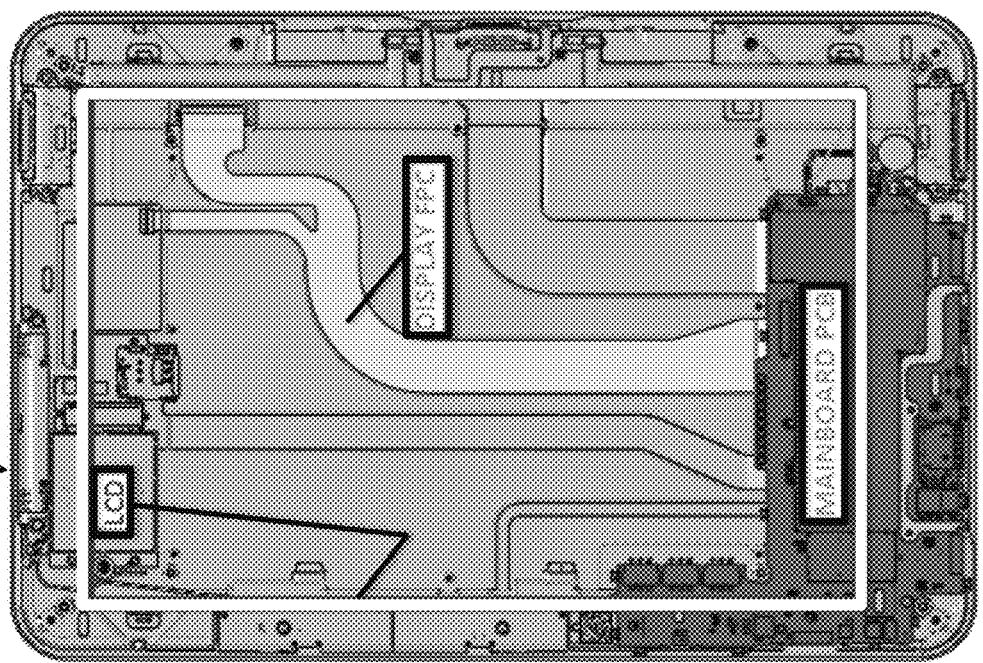
FIG. 6 illustrates the flexible printed circuit (FPC) cabling used to connect the main PCB with the radio module and with the LCD display used with the exemplary intrinsically safe mobile device of FIG. 1.
Figure 6:
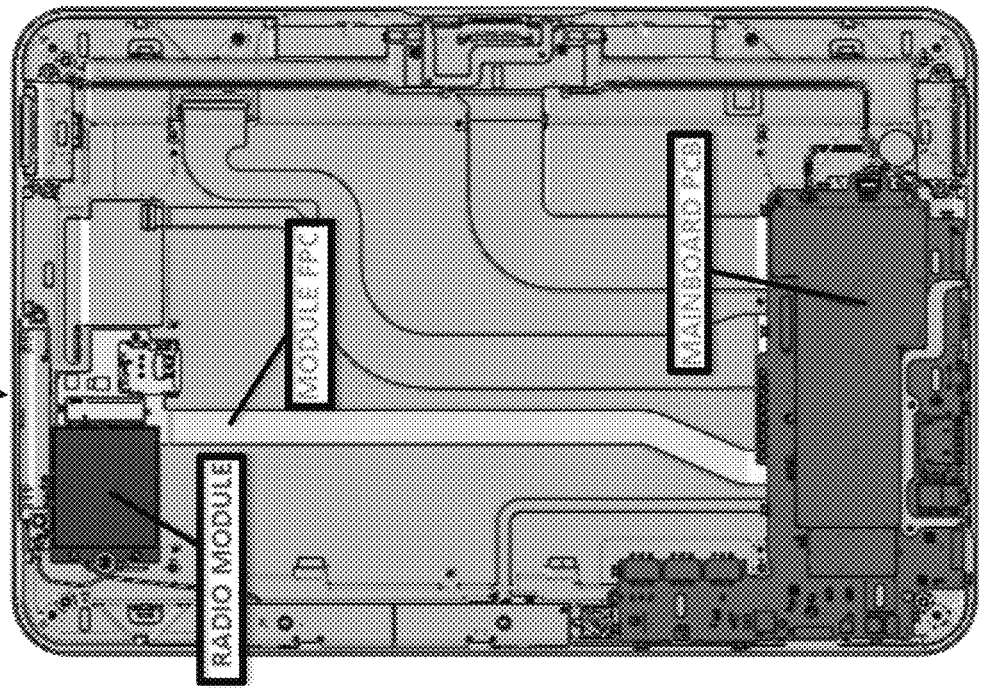

Turning now to FIG. 6, specific isolation techniques are described hereinafter with respect to communications between the main PCB and a radio module and LCD display, as illustrated in the mobile device layouts 610 and 650.

The module FPC that connects the main PCB with the radio module shown in layout 610 is protected on the main PCB using both resistor and MOSFET isolation techniques. Specifically, resistor isolation is used for the signal traces associated with the module FPC. The $I_{max}$ is limited to 5 A using the above-described equation. MOSFET isolation using double MOSFETs are used on the power supply trace. The MOSFETs ensure that the maximum current generated on the power supply trace does not exceed 3 A. This power supply is shared between the radio module and the LCD backlight.

Likewise, the display FPC that connects the main PCB with the LCD display shown in layout 650 is protected on the main PCB using both resistor and MOSFET isolation techniques. Specifically, resistor isolation is used for the signal traces associated with the display FPC. The $I_{max}$ is limited to 5 A using the above-described equation. MOSFET isolation using double MOSFETs are used on the power supply traces to the LCD display. The MOSFETs ensure that the maximum current generated on the power supply trace to the LCD backlight (which is shared with the radio module) does not exceed 3 A. The MOSFETs further ensure that the maximum current generated on the power supply trace to the LCD power supply does not exceed 0.5 A.

Figure 7:
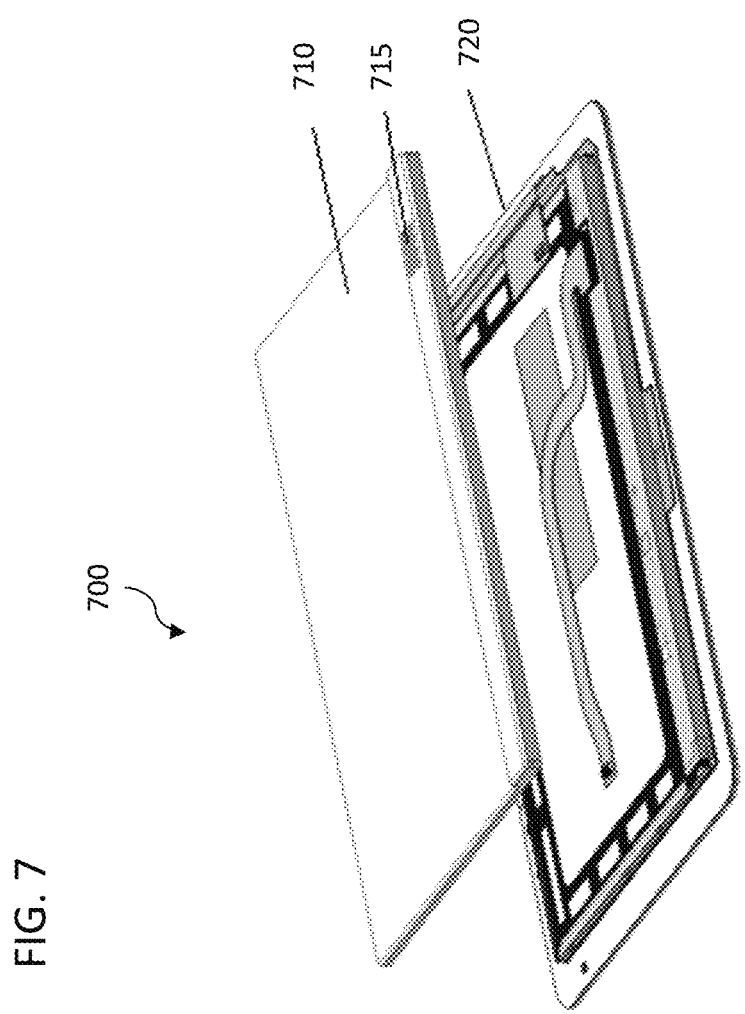
FIG. 7 illustrates additional techniques for improving the intrinsic safety of the flexible printed circuit (FPC) cabling used to connect the main PCB with the radio module and with the LCD display of FIG. 6.

Turning now to FIG. 7, as illustrated in the mobile device layout 700, additional protections can be added around the radio module and/or to the FPC surface shown in FIG. 6 if deemed necessary after conducting spark tests on the mobile device. Specifically, the radio module can be encapsulated with potting material if necessary. In addition, silicone can be added around the components on the FPC surface if necessary. Yet further, a silicone jacket 710, having an FPC opening 715, can be layered onto the entire LCD 720 to provide additional insulation to improve the intrinsically safe characteristics of the mobile device.

As described above with respect to FIG. 2, protections are located on the main PCB 200, under the potted or shielded encapsulation areas, before the traces leave the encapsulation and connect to other protected components or circuitry on the PCB or located elsewhere within the mobile device.

However, even with components and circuitry protected under the potted or shielded encapsulation areas and even with other components already individually certifiable as intrinsically safe, it is still necessary to confirm that the energy level on traces connecting components and circuitry that are not encapsulated be limited to the values permitted by the relevant intrinsically safe standard. Such values are quite complex to determine—they depend on the maximum possible voltages, currents, and energy storage components (like capacitors and inductors), so each trace has to be evaluated individually. Such evaluation also helps determine what type of protection or isolation technique is used with each trace leaving the unprotected part 210 on the PCB. In other words, the allowed capacitance, inductance and minimum clearance values are determined by the protection or isolation technique used for each specific trace. For example, a large resistor may be used for a button, without concern for capacitance, inductance, and clearances because it is known that the current level on that specific trace is low enough that, even if the trace or switch on that trace is short circuited, no ignition can occur. On the other hand, because it is necessary to reserve some power to the radio module for it to work properly, it is necessary to assess the capacitance and inductance in the radio module to ensure that the buffers are still not high enough to cause an ignition with the available energy transmitted along the traces leaving the potted or shielded encapsulation areas that go to the radio module.

Similarly, the battery is protected using the same methods and techniques described above. For example, (i) there are resistors included on the signal lines to prevent the poles from getting shorted inside the battery, (ii) there are double MOSFETs used to allow sufficient energy to flow from the battery without losses, but capable of being cut off in case the current levels get too high, and (iii) there are clearances between the traces that connect the encapsulated area of the battery with the encapsulated area on the main PCB.

In view of the foregoing detailed description of preferred embodiments of the present invention, it readily will be understood by those persons skilled in the art that the present invention is susceptible to broad utility and application. While various aspects have been described herein, additional aspects, features, and methodologies of the present invention will be readily discernable therefrom. Many embodiments and adaptations of the present invention other than those herein described, as well as many variations, modifications, and equivalent arrangements and methodologies, will be apparent from or reasonably suggested by the present invention and the foregoing description thereof, without departing from the substance or scope of the present invention. Furthermore, any sequence(s) and/or temporal order of steps of various processes described and claimed herein are those considered to be the best mode contemplated for carrying out the present invention. It should also be understood that, although steps of various processes may be shown and described as being in a preferred sequence or temporal order, the steps of any such processes are not limited to being carried out in any particular sequence or order, absent a specific indication of such to achieve a particular intended result. In most cases, the steps of such processes may be carried out in various different sequences and orders, while still falling within the scope of the present inventions. In addition, some steps may be carried out simultaneously. Accordingly, while the present invention has been described herein in detail in relation to preferred embodiments, it is to be understood that this disclosure is only illustrative and exemplary of the present invention and is made merely for purposes of providing a full and enabling disclosure of the invention. The foregoing disclosure is not intended nor is to be construed to limit the present invention or otherwise to exclude any such other embodiments, adaptations, variations, modifications and equivalent arrangements, the present invention being limited only by the claims appended hereto and the equivalents thereof.

I claim:

1. An intrinsically safe mobile device having a housing, a power supply, a printed circuit board (PCB), and user interface components, the power supply providing power to the PCB and to one or more of the user interface components, the power supply and PCB contained within the housing, the user interface components contained within the housing or accessible on or through the housing, the intrinsically safe mobile device comprising:

a plurality of non-intrinsically safe electronic components mounted on an unprotected part of the PCB, wherein the plurality of non-intrinsically safe electronic components include components and circuitry that have high capacitance, high inductance, or low clearance, the plurality of non-intrinsically safe electronic components being encapsulated to maintain risk of sparking and surface heating below thresholds required for the encapsulated electronic components to be certified as intrinsically safe, wherein one or more of the plurality of non-intrinsically safe electronic components are encapsulated by fully encasing the non-intrinsically safe electronic components in a potting material, the potting material defining a potted area on the unprotected part of the PCB, the potting material completely surrounding and filling in all of the space around the encapsulated electronic components contained therein between a mounting surface of the PCB to at least 0.1 mm above all of the encapsulated electronic components and extending at least 0.1 mm in thickness beyond the outermost of the encapsulated electronic components contained therein; and a plurality of intrinsically safe electronic components mounted on a protected part of the PCB;

wherein the intrinsically safe mobile device has a form factor, speed, and functionality of a conventional non-intrinsically safe mobile device.

2. An intrinsically safe mobile device having a housing, a power supply, a printed circuit board (PCB), and user interface components, the power supply providing power to the PCB and to one or more of the user interface components, the power supply and PCB contained within the housing, the user interface components contained within the housing or accessible on or through the housing, the intrinsically safe mobile device comprising:

a plurality of non-intrinsically safe electronic components mounted on an unprotected part of the PCB, wherein the plurality of non-intrinsically safe electronic components include components and circuitry that have high capacitance, high inductance, or low clearance, the plurality of non-intrinsically safe electronic components being encapsulated to maintain risk of sparking and surface heating below thresholds required for the encapsulated electronic components to be certified as intrinsically safe, wherein one or more of the plurality of non-intrinsically safe electronic components are encapsulated by surrounding the non-intrinsically safe electronic components with a potting material that defines a potted area on the unprotected part of the PCB and wherein the potted area is covered by an insulation plastic sheet that is in sealing contact with the potting material along the potted area, wherein the potting material completely surrounds all of the encapsulated electronic components contained within the potted area and extends at least a 0.1 mm in thickness around the outermost of the encapsulated electronic components contained therein and wherein the insulation plastic sheet is at least 0.05 mm in thickness; and a plurality of intrinsically safe electronic components mounted on a protected part of the PCB;

wherein the intrinsically safe mobile device has a form factor, speed, and functionality of a conventional non-intrinsically safe mobile device.

3. The intrinsically safe mobile device of claim 2 wherein one or more of the plurality of non-intrinsically safe electronic components mounted on the unprotected part of the PCB is connected with one or more of the plurality of intrinsically safe electronic components mounted on the protected part of the PCB using a trace and wherein the trace is certified as intrinsically safe by using one or more protection techniques, wherein the one or more protection techniques are chosen from: a resistor, a double MOSFET clamping circuit, a capacitor, a fuse, and maintaining a minimum clearance space from other traces.

4. The intrinsically safe mobile device of claim 2 wherein one or more of the plurality of non-intrinsically safe electronic components mounted on the unprotected part of the PCB is connected with one or more of the user interface components using a flexible printed circuit (FPC) cabling and wherein the FPC cabling is certified as intrinsically safe by using one or more protection techniques, wherein the one or more protection techniques are chosen from: a resistor, a double MOSFET clamping circuit, a capacitor, a fuse, and maintaining a minimum clearance space from other FPC cables.

5. The intrinsically safe mobile device of claim 2 wherein the power supply is a battery and wherein the battery is certified as intrinsically safe by encapsulating the battery.

6. The intrinsically safe mobile device of claim 5 wherein power supply lines from the battery are certified as intrinsically safe by using one or more protection techniques chosen from: a resistor, a double MOSFET clamping circuit, a capacitor, a fuse, and maintaining a minimum clearance space between power supply lines.

7. An intrinsically safe mobile device having a housing, a power supply, a printed circuit board (PCB), and user interface components, the power supply providing power to the PCB and to one or more of the user interface components, the power supply and PCB contained within the housing, the user interface components contained within the housing or accessible on or through the housing, the intrinsically safe mobile device comprising:

a plurality of non-intrinsically safe electronic components mounted on an unprotected part of the PCB, wherein the plurality of non-intrinsically safe electronic components include components and circuitry that have high capacitance, high inductance, or low clearance, the plurality of non-intrinsically safe electronic components being encapsulated to maintain risk of sparking and surface heating below thresholds required for the encapsulated electronic components to be certified as intrinsically safe, wherein one or more of the plurality of non-intrinsically safe electronic components mounted on the unprotected part of the PCB are encapsulated by surrounding the non-intrinsically safe electronic components with a potting material that defines a potted area on the unprotected part of the PCB and wherein the potted area is covered by a grounded metal shield that is in sealing contact with the potting material along the potted area, wherein the potting material completely surrounds all of the encapsulated electronic components contained within the potted area, the potting material having a height above a mounting surface of the PCB that extends above the encapsulated electronic components contained within the potted area and having a thickness of at least 0.1 mm, a metal grounding wall embedded within the potting material around an outer edge of the potted area, and the grounded metal shield extending around and over the metal grounding wall; and a plurality of intrinsically safe electronic components mounted on a protected part of the PCB;

wherein the intrinsically safe mobile device has a form factor, speed, and functionality of a conventional non-intrinsically safe mobile device.

8. The intrinsically safe mobile device of claim 7 wherein one or more of the plurality of non-intrinsically safe electronic components mounted on the unprotected part of the PCB is connected with one or more of the plurality of intrinsically safe electronic components mounted on the protected part of the PCB using a trace and wherein the trace is certified as intrinsically safe by using one or more protection techniques, wherein the one or more protection techniques are chosen from: a resistor, a double MOSFET clamping circuit, a capacitor, a fuse, and maintaining a minimum clearance space from other traces.

9. The intrinsically safe mobile device of claim 1 wherein one or more of the plurality of non-intrinsically safe electronic components mounted on the unprotected part of the PCB is connected with one or more of the plurality of intrinsically safe electronic components mounted on the protected part of the PCB using a trace and wherein the trace is certified as intrinsically safe by using one or more protection techniques, wherein the one or more protection techniques are chosen from: a resistor, a double MOSFET clamping circuit, a capacitor, a fuse, and maintaining a minimum clearance space from other traces.

10. The intrinsically safe mobile device of claim 7 wherein one or more of the plurality of non-intrinsically safe electronic components mounted on the unprotected part of the PCB is connected with one or more of the user interface components using a flexible printed circuit (FPC) cabling and wherein the FPC cabling is certified as intrinsically safe by using one or more protection techniques, wherein the one or more protection techniques are chosen from: a resistor, a double MOSFET clamping circuit, a capacitor, a fuse, and maintaining a minimum clearance space from other FPC cables.

11. The intrinsically safe mobile device of claim 1 wherein one or more of the plurality of non-intrinsically safe electronic components mounted on the unprotected part of the PCB is connected with one or more of the user interface components using a flexible printed circuit (FPC) cabling and wherein the FPC cabling is certified as intrinsically safe by using one or more protection techniques.

12. The intrinsically safe mobile device of claim 11 wherein the one or more protection techniques are chosen from: a resistor, a double MOSFET clamping circuit, a capacitor, a fuse, and maintaining a minimum clearance space from other FPC cables.

13. The intrinsically safe mobile device of claim 1 wherein the power supply is a battery and wherein the battery is certified as intrinsically safe by encapsulating the battery.

14. The intrinsically safe mobile device of claim 13 wherein power supply lines from the battery are certified as intrinsically safe by using one or more protection techniques chosen from: a resistor, a double MOSFET clamping circuit, a capacitor, a fuse, and maintaining a minimum clearance space between power supply lines.

15. An intrinsically safe mobile device having a housing, a power supply, a printed circuit board (PCB), and user interface components, the power supply providing power to the PCB and to one or more of the user interface components, the power supply and PCB contained within the housing, the user interface components contained within the housing or accessible on or through the housing, the intrinsically safe mobile device comprising:
 a plurality of non-intrinsically safe electronic components mounted on an unprotected part of the PCB, the plurality of non-intrinsically safe electronic components being encapsulated to maintain risk of sparking and surface heating below thresholds required for the encapsulated electronic components to be certified as intrinsically safe; and
 a plurality of intrinsically safe electronic components mounted on a protected part of the PCB;
wherein a first of the plurality of encapsulated electronic components mounted on the unprotected part of the PCB is connected with a respective one of the plurality of intrinsically safe electronic components on the protected part of the PCB using a trace, wherein a second of the plurality of encapsulated electronic components mounted on the unprotected part of the PCB is connected with a respective one of the user interface components using a flexible printed circuit (FPC) cabling, and wherein the trace and the FPC cabling are certified as intrinsically safe by using one or more protection techniques.

16. The intrinsically safe mobile device of claim 15 the one or more protection techniques are chosen from: a resistor, a double MOSFET clamping circuit, a capacitor, a fuse, and maintaining a minimum clearance space.

17. The intrinsically safe mobile device of claim 15 the power supply is a battery and wherein the battery is certified as intrinsically safe by encapsulating the battery.

18. The intrinsically safe mobile device of claim 17 power supply lines from the battery are certified as intrinsically safe by using one or more protection techniques chosen from: a resistor, a double MOSFET clamping circuit, a capacitor, a fuse, and maintaining a minimum clearance space between power supply lines.

19. The intrinsically safe mobile device of claim 7 wherein the power supply is a battery and wherein the battery is certified as intrinsically safe by encapsulating the battery.

20. The intrinsically safe mobile device of claim 19 wherein power supply lines from the battery are certified as intrinsically safe by using one or more protection techniques chosen from: a resistor, a double MOSFET clamping circuit, a capacitor, a fuse, and maintaining a minimum clearance space between power supply lines.

* * * * *